United States Patent
Ives

(10) Patent No.: US 8,063,716 B1
(45) Date of Patent: Nov. 22, 2011

(54) WIDEBAND SIGNAL SPLITTER USING COMBINATION OF DISCRETE TRANSFORMERS AND WILKINSON SPLITTERS

(75) Inventor: Fred Herbert Ives, Liberty Lake, WA (US)

(73) Assignee: Agilent Technologies, Inc., Santa Clara, CA (US)

( * ) Notice: Subject to any disclaimer, the term of this patent is extended or adjusted under 35 U.S.C. 154(b) by 351 days.

(21) Appl. No.: 12/362,592

(22) Filed: Jan. 30, 2009

(51) Int. Cl.
*H03H 7/38* (2006.01)
*H03H 7/48* (2006.01)
(52) U.S. Cl. ............... 333/131; 333/125; 333/127
(58) Field of Classification Search .......... 333/124, 333/125, 127, 128, 131, 136
See application file for complete search history.

(56) References Cited

U.S. PATENT DOCUMENTS

| | | | | |
|---|---|---|---|---|
| 4,367,445 A | * | 1/1983 | Dydyk | 333/127 |
| 4,945,321 A | * | 7/1990 | Oppelt et al. | 333/119 |
| 5,198,787 A | * | 3/1993 | Sano et al. | 333/128 |
| 5,668,510 A | * | 9/1997 | Humpherys | 333/127 |
| 7,663,449 B2 | * | 2/2010 | Podell | 333/125 |

OTHER PUBLICATIONS

Lee et al.; "A General Design Formula of Multi-Section Power Divider Based on Singly Terminated Filter Design Theory", 2001 IEEE MTT-S International Microwave Symposium Digest; vol. 2, pp. 1297-1300; Phoenix, AZ, May 20-25, 2001.*
Wang et al.; "A New Broadband Miniature RF Power Splitter", IMWS 2008 IEEE MTT-S International Microwave Workshop Series on Art of Miniaturizing RF and Microwave Passive Components; pp. 180-182; Chengdu, China, Dec. 14-15, 2008.*

* cited by examiner

*Primary Examiner* — Barbara Summons

(57) ABSTRACT

A power divider includes an input port and a plurality of output ports. The power divider further includes a splitter fabricated from a plurality of discrete elements including at least one transformer having a ferrite core. The splitter has an input and a plurality of outputs. The power divider further includes a plurality of transmission lines fabricated on a printed circuit board. Each transmission line has a first end coupled to one of the outputs of the splitter and a second end coupled to one of the output ports, and includes a plurality of transmission line sections between the first end and the second end. The power divider further includes a plurality of balance resistors each having a first end connected between sections of one of the transmission lines, and having a second end connected between sections of another of the transmission lines.

17 Claims, 7 Drawing Sheets

WIDEBAND SIGNAL SPLITTER USING COMBINATION OF DISCRETE TRANSFORMERS AND WILKINSON SPLITTERS

BACKGROUND

Radio Frequency (RF) and microwave signals and components are employed in a variety of devices, including mobile communication devices such as mobile telephones and communication test equipment. One type of commonly employed RF component is a passive signal splitter or power divider which is may be used to split or divide an RF or microwave signal and provide the divided signal to two or more output ports. Passive signal splitters often can also be used as a signal combiner. Such devices are sometimes referred to as reciprocal devices. The terms "signal splitter," "signal combiner," "power splitter," and "power combiner" are sometimes used interchangeably with respect to such devices.

A number of different parameters are used to define the performance of a signal splitter. Among these parameters are insertion loss, port isolation, input impedance match (e.g., input return loss), and output impedance match (e.g., output return loss)—all of which can be characterized as a function of an operating frequency range. Other characteristics which are often important include size, component and manufacturing loss, repeatability, and reliability.

One application for such a signal splitter is in a test system which may be used to combine and/or split transmit and receive signals in the RF and microwave frequency bands. In some test systems, it may be desired or necessary to test signals over a wide range of frequencies. For example, in one particular system, it is desired to test signals over a frequency range extending from below VHF (e.g., 10 MHz), up to 6 GHz.

Lumped or discrete element signal splitters have been produced which can operate well at the lower end of this frequency range, but their performance degrades at higher frequencies (e.g., above 2.5 GHz). Meanwhile, Wilkinson power splitters have been produced which can operate well at the higher end of this frequency range, but their performance degrades at lower frequencies (e.g., below 400 MHz). Wilkinson splitters have practical size limitations and become very large below VHF frequencies.

What is needed, therefore, is a signal splitter that can provide acceptable performance characteristics over a very wide bandwidth.

SUMMARY

In an example embodiment, a signal splitter comprises: an input port; and first, second, third, and fourth output ports. The signal splitter further comprises: a first transformer having an input connected to the input port, and having first and second intermediate outputs, a first signal path from the input to the first intermediate output including a portion passing through a first ferrite tube, and a second signal path from the input to the second intermediate output including a portion passing through a second ferrite tube; a second transformer having an input coupled to the first intermediate output of the first transformer, and having first and second outputs; a third transformer having an input coupled to the second intermediate output of the first transformer, and having first and second outputs; a first Wilkinson device having first and second inputs coupled to the first and second outputs of the second transformer, and having first and second outputs coupled to the first and second output ports of the signal splitter; and a second Wilkinson device having first and second inputs coupled to the first and second outputs of the third transformer, and having first and second outputs coupled to the third and fourth output ports of the signal splitter.

In another example embodiment, a method is provided of dividing a signal. The method comprises: providing the signal to an input of a first transformer, and outputting first and second intermediate output signals from first and second intermediate outputs of the first transformer, a first signal path from the input to the first intermediate output including a portion passing through a first ferrite tube, and a second signal path from the input to the second intermediate output including a portion passing through a second ferrite tube; providing the first intermediate output signal to an input of a second transformer, and outputting first and second transformed signals from first and second intermediate outputs of the second transformer; providing the second intermediate output signal to an input of a third transformer, and outputting third and fourth transformed output signals from first and second intermediate outputs of the third transformer; providing the first and second transformed signals to first and second inputs of a first Wilkinson device, and outputting first and second divided output signals from first and second outputs of the first Wilkinson device; and providing the third and fourth transformed signals to first and second inputs of a second Wilkinson device, and outputting third and fourth divided output signals from first and second outputs of the second Wilkinson device.

In yet another example embodiment, a power divider comprises: an input port; a plurality of output ports; a splitter comprising a plurality of discrete elements including at least one transformer having a ferrite core, the splitter having an input and a plurality of outputs; a plurality of transmission lines fabricated on a printed circuit board, each transmission line having a first end coupled to one of the outputs of the splitter and having a second end coupled to one of the output ports, and having a plurality of transmission line sections between the first end and the second end; and a plurality of balance resistors each having a first end connected between sections of one of the transmission lines, and having a second end connected between sections of another of the transmission lines.

BRIEF DESCRIPTION OF THE DRAWINGS

The exemplary embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

In the following detailed description, for purposes of explanation and not limitation, example embodiments disclosing specific details are set forth in order to provide a thorough understanding of an embodiment according to the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparati and methods may be omitted so as to not obscure the description of the example embodiments. Such methods and apparati are clearly within the scope of the present teachings.

As used herein, the term "radio frequency" or "RF" pertains to HF, VHF, UHF, SHF and even millimeter wave frequencies to the extent that technology permits the devices and circuits disclosed herein to be fabricated and operated at such frequencies. Also, unless otherwise noted, when a first device is said to be connected to a second device, this encompasses cases where one or more intermediate devices may be employed to connect the two devices to each other. However, when a first device is said to be directly connected to a second device, this encompasses only cases where the two devices are connected to each other without any intermediate or intervening devices. Similarly, when a signal is said to be coupled to a device, this encompasses cases where one or more intermediate devices may be employed to couple the signal to the device. However, when a signal is said to be directly coupled to a device, this encompasses only cases where the signal is directly coupled to the device without any intermediate or intervening devices.

Figure 1:
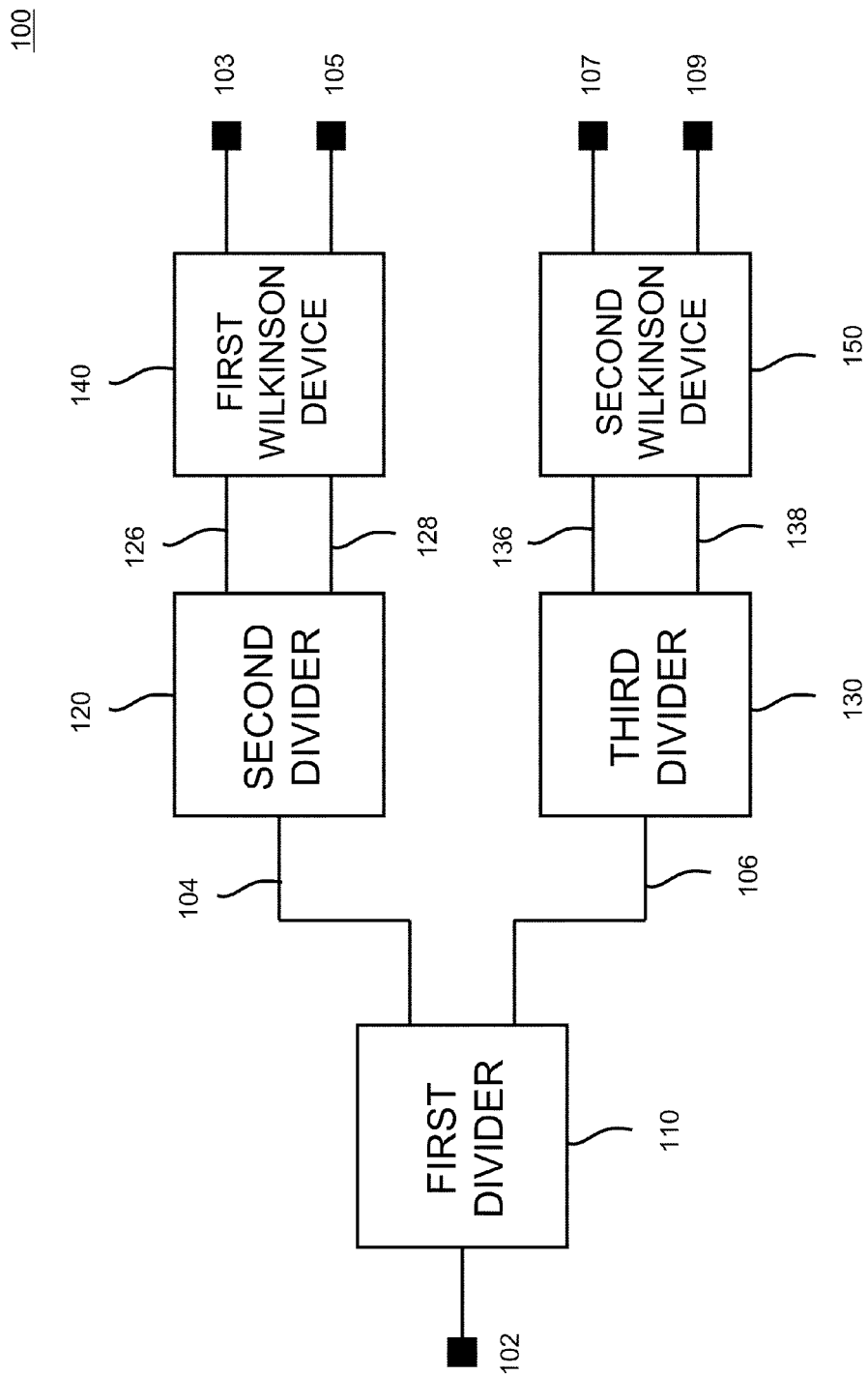
FIG. 1 shows a block diagram of one embodiment a device.

FIG. 1 shows a block diagram of one embodiment a device 100. Device 100 has an input port 102 and four output ports 103, 105, 107 and 109. Signal splitter 100 includes a first divider 110, a second divider 120, a third divider 130, a first Wilkinson device 140, and a second Wilkinson device 150. In one embodiment, input port 102, and output ports 103, 105, 107 and 109, each have a nominal impedance of 50 ohms. In an embodiment as described in greater detail below, first, second and third dividers 110, 120 and 130 are fabricated with discrete or lumped elements. Beneficially, first divider 110 comprises a coax and ferrite transformer, and second and third dividers 120 and 130 each comprise two-wire transformers. Further details of this beneficial arrangement will be described below with respect to FIGS. 2-7.

As device 100 is a reciprocal device, it can be operated as a signal combiner or as a signal divider. When device 100 is operated as a signal combiner, port 102 may be referred to as an output port and ports 103, 105, 107 and 109 may be referred to as input ports. Sometimes ports 103, 105 107 and 109 may be referred to as signal ports, and port 102 may be referred to as a combined port. For simplicity of explanation, and without any loss in generality, through the remainder of this disclosure port 102 will be referred to as an input port, and ports 103, 105, 107 and 109 will be referred to as output ports.

An operation of device 100 will now be explained in a configuration where device 100 operates as a signal splitter. In that case, first divider 110 receives an input signal at input port 102 and divides the input signal to output first and second intermediate signals at first and second intermediate outputs 104 and 106. Second divider 120 receives the first intermediate signal from first divider 110 at first intermediate output 104 and outputs first and second divided signals at first and second outputs 126 and 128. Third divider 130 receives the second intermediate signal from first divider 110 at second intermediate output 106 and outputs third and fourth divided signals at third and fourth outputs 136 and 138. First Wilkinson device 140 receives the first and second divided signals from second divider 120 and couples the signals to first and second output ports 103 and 105. Second Wilkinson device 150 receives the third and fourth divided signals from third divider 130 and couples the signals to third and fourth output ports 107 and 109.

Figure 2:
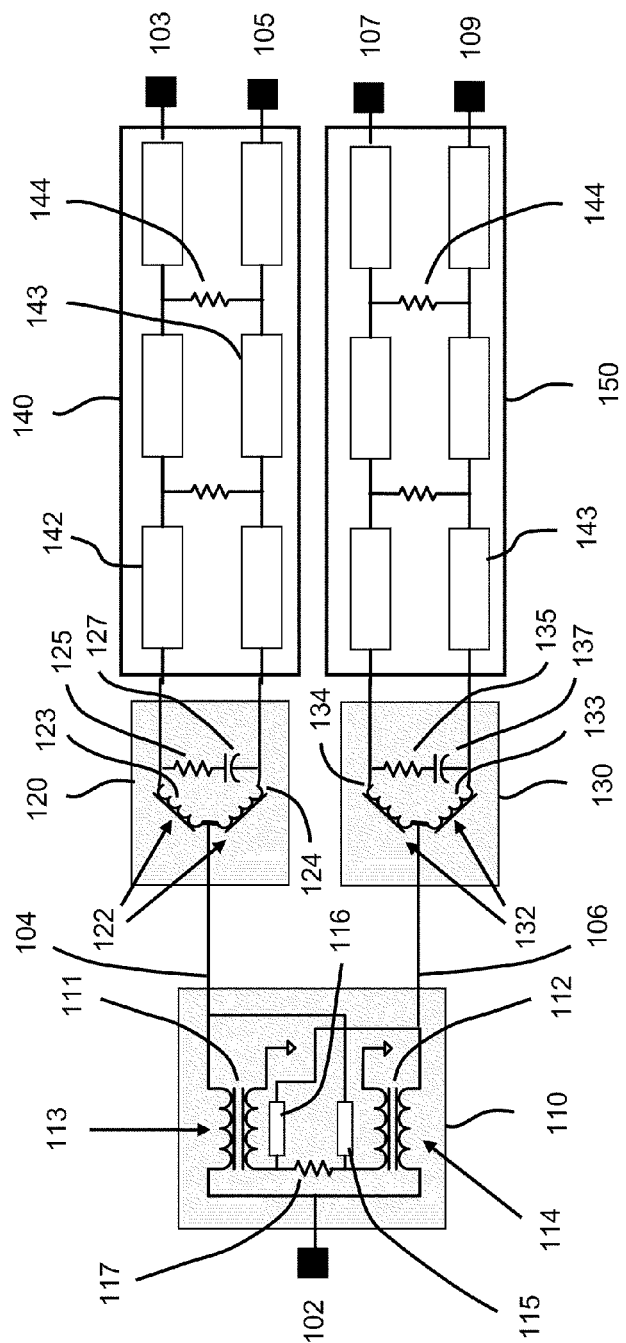
FIG. 2 shows a schematic diagram of one embodiment a signal splitter.

FIG. 2 shows a schematic diagram of one embodiment a signal splitter 200. Like numbers in FIGS. 1 and 2 refer to like elements. As illustrated in FIG. 2, first 110, second 120 and third 130 dividers each comprise a transformer.

First and second Wilkinson devices 140 and 150 each include a first transmission line comprising a plurality of first transmission line sections 142 connected in series between a first input of the Wilkinson device and a first output of the Wilkinson device, and a second transmission line comprising a plurality of second transmission line sections 143 connected in series between a second input of the Wilkinson device and a second output of the Wilkinson device. Transmission line sections 142 and 143 each have a characteristic impedance $Z_0$ (e.g., 50 ohms, or a slightly different impedance to better match the transformers 120 & 130 parameters). First and second Wilkinson devices 140 and 150 also each include a plurality of balance resistors 144 connected between the first transmission line sections 142 and the second transmission line sections 143. First and second Wilkinson devices 140 and 150 in FIG. 2 each have two sections, but in other embodiments, a different number of sections may be employed.

In a beneficial embodiment, illustrated in greater detail in FIGS. 3-7 below, first divider 110 comprises a coax and ferrite transformer, and second and third dividers 120 and 130 each comprise two-wire transformers, In that case, first divider 110 includes: first and second ferrite tubes 111 and 112; first and second coax lines 113 and 114 passing through first and second ferrite tubes 111 and 112, respectively; a third coax line 115 passing along an outside of first ferrite tube 111; a fourth coax line 116 passing along an outside of second ferrite tube 112; and a balance resistor 117 (e.g., 50 ohms).

Ferrite tubes 111 and 112 comprises annular or nearly-annular ferrite structures which surround, or substantially surround, a radial periphery of first and second coax lines 113 and 114. In practical embodiments, ferrite tubes 111 and 112 may be realized by components that are often referred to as "ferrite cores," ferrite beads," etc. First and second ferrite tubes 111 and 112 each may comprise a stacked arrangement of two or more ferrite cores, each of which may have the shape of a toroid, a hollow cylinder, a hollow prism, etc.

First coax line 113 has an inner conductor and an outer conductor. The inner conductor of first coax line 113 has a first end connected to input port 102 and has a second end connected to the first intermediate output 104. The outer conductor of the first coax line has a first end connected to a first side of the balance resistor 117 and has a second end connected to ground. Second coax line 114 also has an inner conductor and an outer conductor. The inner conductor of second coax line 114 has a first end connected to input port 102 and has a second end connected to second intermediate output 106. The outer conductor of second coax line 114 has a first end connected to a second side of balance resistor 117 and has a second end connected to ground. Third coax line 115 an inner conductor and an outer conductor. The inner conductor of third coax line 115 has a first end connected to the second side of balance resistor 117 and a second end connected to first intermediate output 104. Fourth coax line 116 also has an inner conductor and an outer conductor. The inner conductor of fourth coax line 116 has a first end connected to the first side of balance resistor 117 and a second end connected to second intermediate output 106. Both ends of the outer conductor of third coax line 115 are connected to ground. Both ends of the outer conductor of fourth coax line 116 are connected to ground. In one embodiment, the input of first divider 110 has a nominal impedance of 50 ohms, and each of the intermediate outputs 104 and 106 has a nominal impedance of 25 ohms.

Also, in a beneficial arrangement, second divider 120 includes ferrite tube 122, first and second wires 123 and 124 which pass through ferrite tube 122, and a series combination of a resistor 125 and a capacitor 127 connected between the outputs 126 and 128 of the second divider 120. Similarly, third divider 130 includes ferrite tube 132, first and second wires 133 and 134 which pass through ferrite tube 132, and a series combination of a resistor 135 and a capacitor 137 connected between the outputs 136 and 138 of third divider 130. In one embodiment, the input of each of the second and third dividers 120 and 130 has a nominal impedance of 25 ohms, and each of the outputs 126, 128, 136 and 138 has a nominal impedance of 50 ohms. The capacitors 127 and 137 may be included or excluded to better match the parameters of the transformers 120 & 130.

Figure 3:
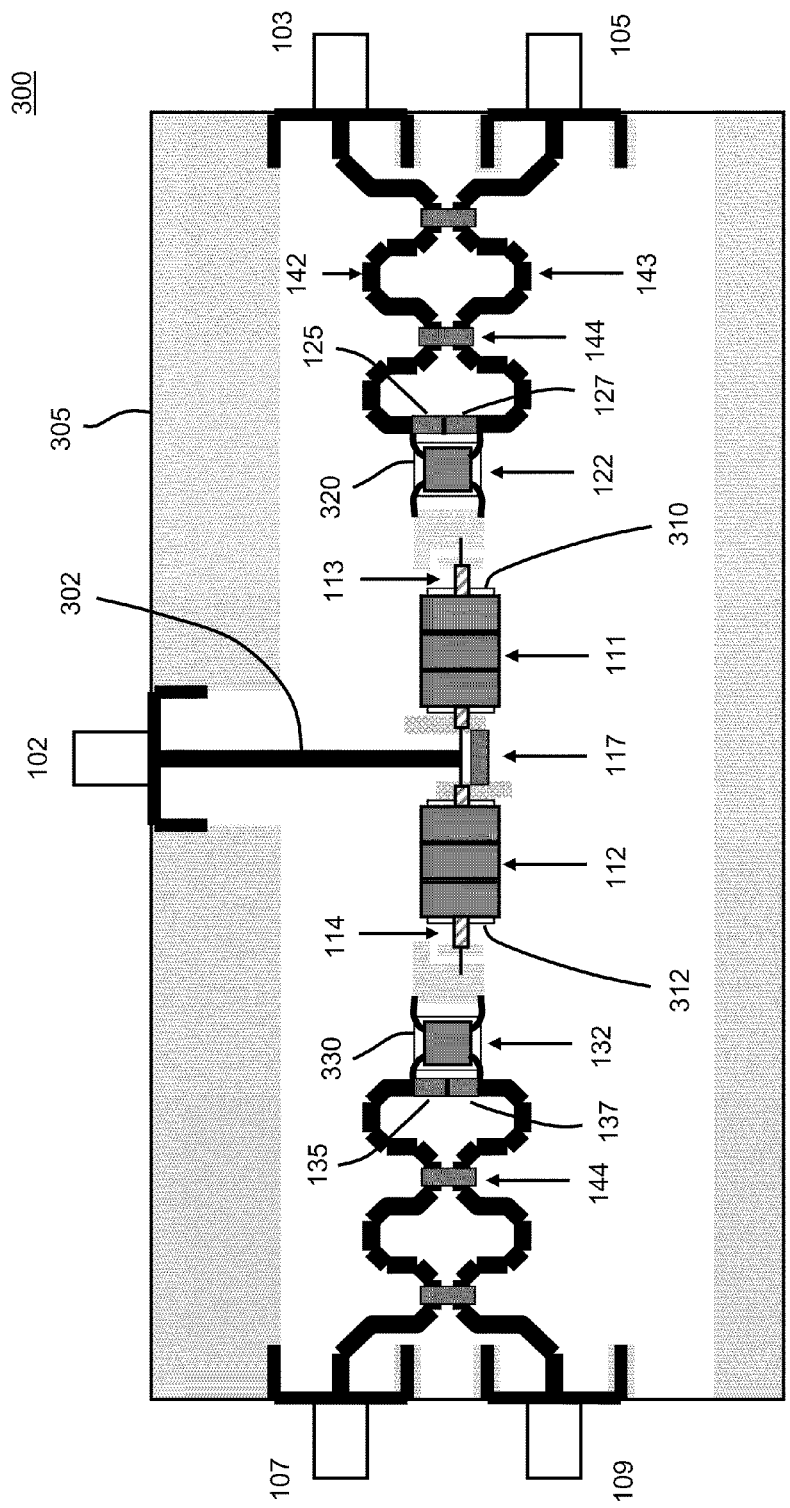
FIG. 3 shows a top view of one embodiment a signal splitter.
Figure 4:
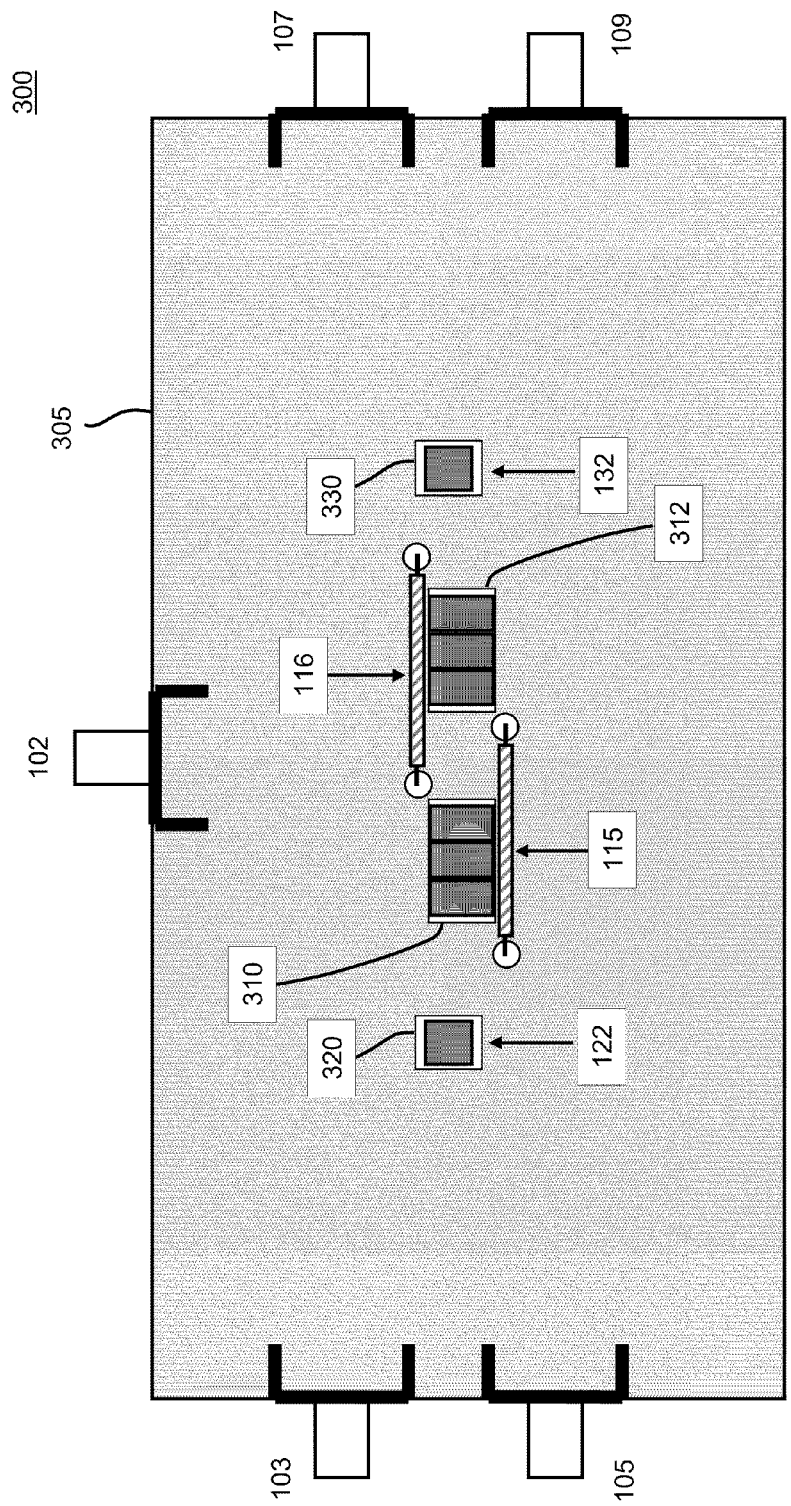
FIG. 4 shows a bottom view of one embodiment a signal splitter.

FIGS. 3 and 4 show a top view (FIG. 3) and a bottom view (FIG. 4) of one embodiment a signal splitter 300. Like numbers in FIGS. 1 through 4 refer to like elements.

Signal splitter 300 includes a printed circuit board 305 having a first side (shown in the top view of FIG. 3) and a second side (shown in the bottom view of FIG. 4). Printed circuit board 305 includes an input trace 302 from input port 102 to the first divider 110 comprising the ferrite and coax transformer of ferrite tubes 111/112, coax wires 113/114. Printed circuit board 305 includes also includes holes 310, 312, 320 and 330 passing therethrough. Beneficially, input trace 302 is a microstrip transmission line having a characteristic impedance $Z_{IN}$. In one embodiment, $Z_{IN}$=50 ohms.

Figure 5:
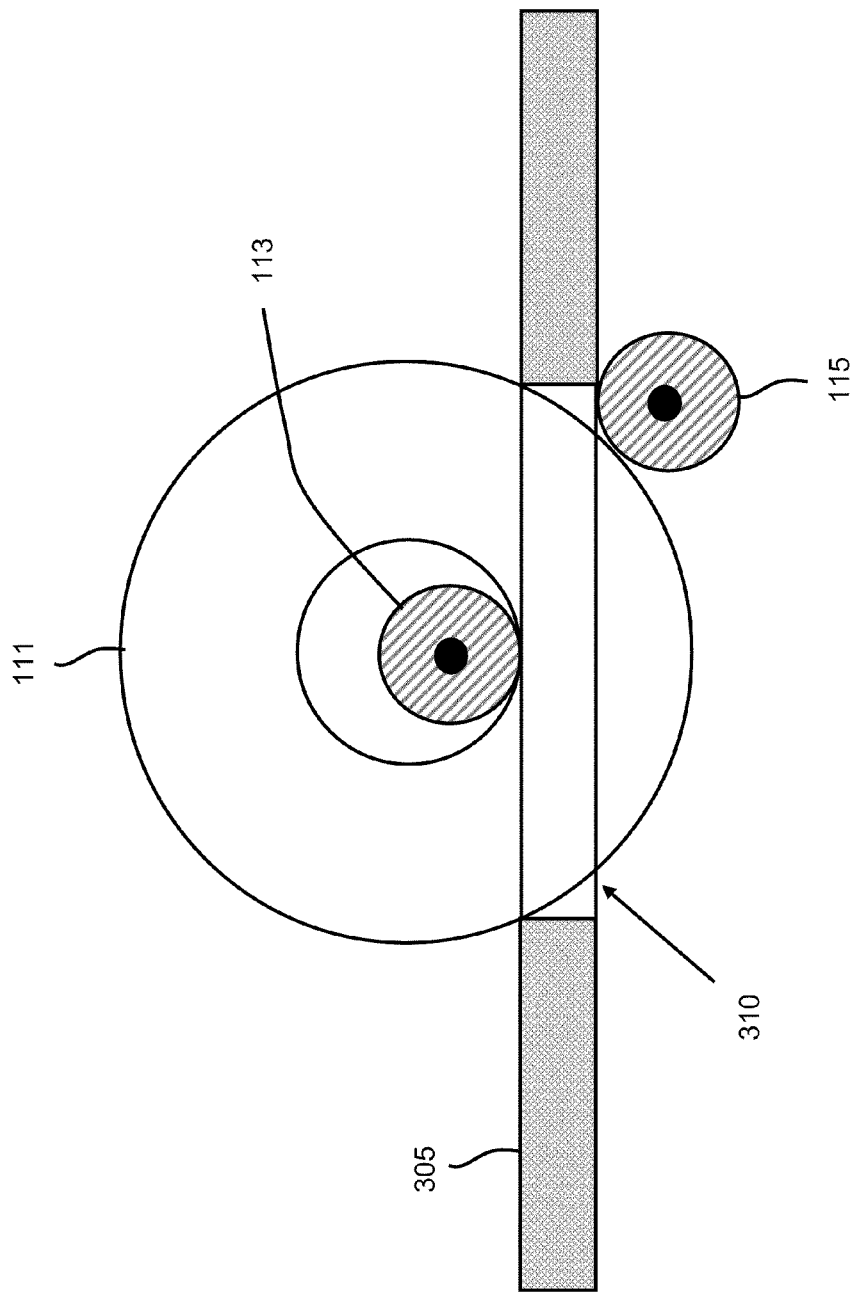
FIG. 5 shows a cross-sectional view of a layout of a portion of one embodiment of a transformer.
Figure 6:
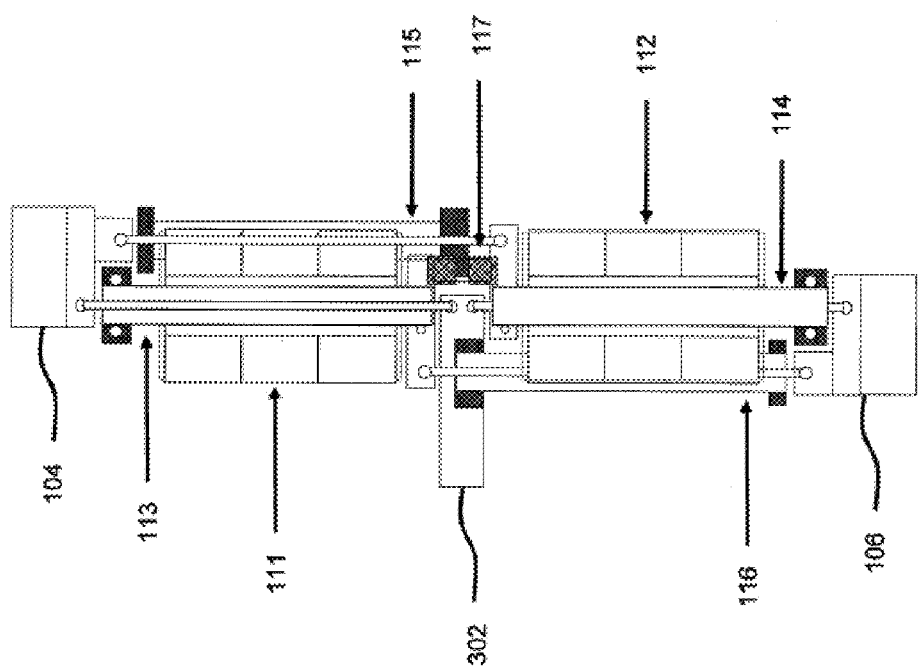
FIG. 6 illustrates one embodiment of a transformer.

As can be more clearly seen in FIGS. 5 & 6, first and second ferrite tunes 111 and 112 extend partially through a corresponding one of the holes 310 and 312 of printed circuit board 305. Also, first and second coax lines 113 and 114 pass through first and second ferrite tubes 111 and 112, respectively, and are disposed on the first side of printed circuit board 305. Meanwhile, third and fourth coax lines 115 and 116 are disposed on the second side of printed circuit board 305. Furthermore, ferrite tubes 122 and 132 of second and third transformers 120 and 130 extend through a corresponding one of the holes 320 and 330 of printed circuit board 305.

In one example embodiment: first and second ferrite tubes 111 and 112 each may comprise three AGILENT® Technologies Part Number 9170-2135 ferrite cores (0.143' OD., 0.056" ID, and 0.069" high); the coax lines 113-116 are 0.034" in diameter and 0.300" in length; and second and third dividers 120 and 130 each may comprise a model AGILENT® Technologies Part Number E5515-61003 two-wire transformer. Also, in one example embodiment: printed circuit board 305 is a 0.020" thick ROGERS® 4350B board. In that case input trace 302 is 0.042" wide for 50 ohms characteristic impedance, and the output traces of the first transformer 110 are each 0.110" wide for a characteristic impedance of 25 ohms. It should be understood that these values are only provided as examples of one particular embodiment and other values may be used for other embodiments.

In the embodiment illustrated in FIGS. 3 and 4, each of the Wilkinson devices 140 and 150 comprise a pair of transmission lines having a characteristic impedance $Z_0$ (e.g., 50 ohms) produced by traces on the first side of printed circuit board 305 formed over a ground plane on the second side of printed circuit board 305. Balance resistors 144 are connected between corresponding sections of the pair of transmission lines in each of the Wilkinson devices 140 and 150. Computer Modeling of the Wilkinson devices 140 & 150, the balance resistors 144, and the transformers 120 & 130 can be used to optimize the balance resistors 144 values and the parameters of the transmission lines 142 & 143.

Figure 7:
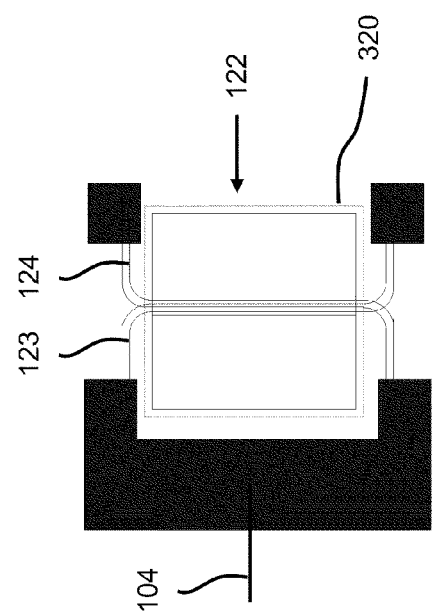
FIG. 7 illustrates one embodiment of another transformer.

FIG. 5 shows a cross-sectional view of a layout of a portion of one embodiment of the first transformer of the signal splitters illustrated in FIGS. 2-4, FIG. 6 illustrates one embodiment of the first transformer 110, and FIG. 7 illustrates one embodiment of a transformer that can be used for the second and third transformers 120 and 130.

Experimental results have shown that one embodiment of a signal splitter as described above with respect to FIGS. 1-7 can yield the following performance across a wide frequency band of 10 MHz to 6 GHz: an insertion loss of 9.0-9.3 dB; an isolation of output port 103 or 105 to output port 107 or 109 port isolation of <29.4-40 dB; an input return loss of 10.2-20 dB; and an output return loss of greater than 14.5 dB across the band.

While exemplary embodiments are disclosed herein, one of ordinary skill in the art appreciates that many variations that are in accordance with the present teachings are possible and remain within the scope of the appended claims. The embodiments therefore are not to be restricted except within the scope of the appended claims.

The invention claimed is:

1. A signal splitter, comprising
    an input port;
    first, second, third, and fourth output ports;
    a first transformer having an input connected to the input port, and having first and second intermediate outputs, a first signal path from the input to the first intermediate output including a portion passing through a first ferrite tube, and a second signal path from the input to the second intermediate output including a portion passing through a second ferrite tube;
    a second transformer having an input coupled to the first intermediate output of the first transformer, and having first and second outputs;
    a third transformer having an input coupled to the second intermediate output of the first transformer, and having first and second outputs;
    a first Wilkinson device having first and second inputs coupled to the first and second outputs of the second transformer, and having first and second outputs coupled to the first and second output ports of the signal splitter; and
    a second Wilkinson device having first and second inputs coupled to the first and second outputs of the third transformer, and having first and second outputs coupled to the third and fourth output ports of the signal splitter.

2. The signal splitter of claim 1, wherein the first transformer comprises:
    the first ferrite tube;
    a first coax line passing through the first ferrite tube;
    the second ferrite tube;
    a second coax line passing through the second ferrite tube;
    a third coax line passing along an outside of the first ferrite tube; and
    a fourth coax line passing along an outside of the second ferrite tube.

3. The signal splitter of claim 2, further comprising a printed circuit board having a first side and a second side, wherein the printed circuit board includes first and second holes passing therethrough, wherein the first and second ferrite tubes each extend partially through a corresponding one of the first and second holes of the printed circuit board, wherein the first and second coax lines are disposed on the first side of the printed circuit board, and wherein the third and fourth coax lines are disposed on the second side of the printed circuit board.

4. The signal splitter of claim 2, wherein the first transformer further comprises a balance resistor; and wherein:
the first coax line has an inner conductor and an outer conductor, the inner conductor of the first coax line having a first end connected to the input port and having a second end connected to the first intermediate output, and the outer conductor of the first coax line having a first end connected to a first side of the balance resistor and having a second end connected to ground;
the second coax line having an inner conductor and an outer conductor, the inner conductor of the second coax line having a first end connected to the input port and having a second end connected to the second intermediate output, and the outer conductor of the second coax line having a first end connected to a second side of the balance resistor and having a second end connected to ground;
the third coax line having an inner conductor and an outer conductor, the inner conductor of the third coax line having a first end connected to the second side of the balance resistor and a second end connected to the first intermediate output, and the outer conductor of the third coax line having a first end and a second end both connected to ground; and
the fourth coax line having an inner conductor and an outer conductor, the inner conductor of the fourth coax line having a first end connected to the first side of the balance resistor and a second end connected to the second intermediate output, and the outer conductor of the fourth coax line having a first end and a second end both connected to ground.

5. The signal splitter of claim 4, wherein each of the second and third transformers comprises:
a ferrite core;
a first wire passing through the ferrite core, the first wire having a first end connected to the input of the transformer and having a second end connected to the first output of the transformer;
a second wire passing through the ferrite core, the second wire having a first end connected to the input of the transformer and having a second end connected to the second output of the transformer; and
one selected from: (1) a resistor; and (2) a series combination of a resistor and a capacitor, connected between the first and second outputs of the transformer.

6. The signal splitter of claim 1, wherein each of the second and third transformers comprises:
a ferrite core;
a first wire passing through the ferrite core, the first wire having a first end connected to the input of the transformer and having a second end connected to the first output of the transformer; and
a second wire passing through the ferrite core, the second wire having a first end connected to the input of the transformer and having a second end connected to the second output of the transformer.

7. The signal splitter of claim 1, wherein each of the first and second Wilkinson devices comprises:
a plurality of first transmission line sections connected in series between the first input of the Wilkinson device and the first output of the Wilkinson device;
a plurality of second transmission line sections connected in series between the second input of the Wilkinson device and the second output of the Wilkinson device; and
a plurality of balance resistors connected between the first transmission line sections and the second transmission line sections.

8. A method of dividing a signal, the method comprising:
providing the signal to an input of a first transformer, and outputting first and second intermediate output signals from first and second intermediate outputs of the first transformer, a first signal path from the input to the first intermediate output including a portion passing through a first ferrite tube, and a second signal path from the input to the second intermediate output including a portion passing through a second ferrite tube;
providing the first intermediate output signal to an input of a second transformer, and outputting first and second transformed signals from first and second intermediate outputs of the second transformer;
providing the second intermediate output signal to an input of a third transformer, and outputting third and fourth transformed signals from first and second intermediate outputs of the third transformer;
providing the first and second transformed signals to first and second inputs of a first Wilkinson device, and outputting first and second divided output signals from first and second outputs of the first Wilkinson device; and
providing the third and fourth transformed signals to first and second inputs of a second Wilkinson device, and outputting third and fourth divided output signals from first and second outputs of the second Wilkinson device.

9. The method of claim 8, wherein the first transformer comprises:
the first ferrite tube;
a first coax line passing through the first ferrite tube;
the second ferrite tube;
a second coax line passing through the second ferrite tube;
a third coax line passing along an outside of the first ferrite tube; and
a fourth coax line passing along an outside of the second ferrite tube.

10. The method of claim 9, wherein the first transformer further comprises a balance resistor; and wherein:
the first coax line has an inner conductor and an outer conductor, the inner conductor of the first coax line having a first end connected to the input of the first transformer and having a second end connected to the first intermediate output, and the outer conductor of the first coax line having a first end connected to a first side of the balance resistor and having a second end connected to ground;
the second coax line having an inner conductor and an outer conductor, the inner conductor of the second coax line having a first end connected to the input of the first transformer and having a second end connected to the second intermediate output, and the outer conductor of the second coax line having a first end connected to a second side of the balance resistor and having a second end connected to ground;
the third coax line having an inner conductor and an outer conductor, the inner conductor of the third coax line having a first end connected to the second side of the balance resistor and a second end connected to the first intermediate output, and the outer conductor of the third coax line having a first end and a second end both connected to ground; and the fourth coax line having an inner conductor and an outer conductor, the inner conductor of the fourth coax line having a first end connected to the first side of the balance resistor and a second end connected to the second intermediate output, and the outer conductor of the fourth coax line having a first end and a second end both connected to ground.

11. The method of claim 10, wherein each of the second and third transformers comprises:
a ferrite core;
a first wire passing through the ferrite core, the first wire having a first end connected to the input of the transformer and having a second end connected to the first output of the transformer; and
a second wire passing through the ferrite core, the second wire having a first end connected to the input of the transformer and having a second end connected to the second output of the transformer.

12. The method of claim 8, wherein each of the second and third transformers comprises:
a ferrite core;
a first wire passing through the ferrite core, the first wire having a first end connected to the input of the transformer and having a second end connected to the first output of the transformer; and
a second wire passing through the ferrite core, the second wire having a first end connected to the input of the transformer and having a second end connected to the second output of the transformer.

13. The method of claim 8, wherein each of the first and second Wilkinson devices comprises:
a plurality of first transmission line sections connected in series between the first input of the Wilkinson device and the first output of the Wilkinson device;
a plurality of second transmission line sections connected in series between the second input of the Wilkinson device and the second output of the Wilkinson device; and
a plurality of balance resistors connected between the first transmission line sections and the second transmission line sections.

14. The method of claim 8 wherein providing the signal to the input of the first transformer comprises providing the signal having a frequency range between 4.0 and 6 GHz to the input of the first transformer.

15. A power divider, comprising:
an input port;
a plurality of output ports;
a splitter comprising a plurality of discrete elements, the splitter having an input and a plurality of splitter outputs;
a plurality of transmission lines fabricated on a printed circuit board, each transmission line having a first end coupled to one of the splitter outputs and having a second end coupled to one of the output ports, and having a plurality of transmission line sections between the first end and the second end; and
a plurality of balance resistors each having a first end connected between sections of one of the transmission lines, and having a second end connected between sections of another of the transmission lines,
wherein the splitter comprises:
a first transformer, the transformer comprising:
a first ferrite tube;
a first coax line passing through the first ferrite tube;
a second ferrite tube;
a second coax line passing through the second ferrite tube;
a third coax line passing along an outside of the first ferrite tube; and
a fourth coax line passing along an outside of the second ferrite tube
second and third transformers each having a ferrite core;
wherein the printed circuit board has a first side and a second side and first and second holes passing therethrough, wherein the first and second ferrite tubes each extend partially through a corresponding one of the first and second holes of the printed circuit board, wherein the first and second coax lines are disposed on the first side of the printed circuit board, and wherein the third and fourth coax lines are disposed on the second side of the printed circuit board.

16. The power divider of claim 15, wherein the first transformer further comprises a balance resistor; and wherein:
the first coax line has an inner conductor and an outer conductor, the inner conductor of the first coax line having a first end connected to the input port and having a second end connected to a first output of the first transformer, and the outer conductor of the first coax line having a first end connected to a first side of the balance resistor and having a second end connected to ground;
the second coax line having an inner conductor and an outer conductor, the inner conductor of the second coax line having a first end connected to the input port and having a second end connected to a second output of the first transformer, and the outer conductor of the second coax line having a first end connected to a second side of the balance resistor and having a second end connected to ground;
the third coax line having an inner conductor and an outer conductor, the inner conductor of the third coax line having a first end connected to the second side of the balance resistor and a second end connected to the first output of the first transformer, and the outer conductor of the third coax line having a first end and a second end both connected to ground; and
the fourth coax line having an inner conductor and an outer conductor, the inner conductor of the fourth coax line having a first end connected to the first side of the balance resistor and a second end connected to the second output of the first transformer, and the outer conductor of the fourth coax line having a first end and a second end both connected to ground.

17. The power divider of claim 15, wherein the second and third transformers each comprise:
a first wire passing through the ferrite core, the first wire having a first end connected to the input of the transformer and having a second end connected to a first one of the splitter outputs;
a second wire passing through the ferrite core, the second wire having a first end connected to the input of the transformer and having a second end connected to a second one of the splitter outputs; and
one selected from: (1) a resistor; and (2) a series combination of a resistor and a capacitor, connected between the first and second ones of the splitter outputs.

* * * * *